United States Patent
Arakawa et al.

(10) Patent No.: US 7,449,768 B2
(45) Date of Patent: Nov. 11, 2008

(54) ELECTROMAGNETIC WAVE SHIELDING SHEET

(75) Inventors: Fumihiro Arakawa, Shinjuku-Ku (JP); Eiji Ohishi, Shinjuku-Ku (JP); Yashuhiko Ishii, Shinjuku-Ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 11/023,434

(22) Filed: Dec. 29, 2004

(65) Prior Publication Data

US 2005/0121213 A1 Jun. 9, 2005

Related U.S. Application Data

(63) Continuation of application No. 10/326,291, filed on Dec. 23, 2002.

(30) Foreign Application Priority Data

Dec. 28, 2001 (JP) ............................. 2001-398852

(51) Int. Cl.
*H01L 23/552* (2006.01)
(52) U.S. Cl. ............................. 257/659; 257/E31.121; 257/E31.122; 361/800; 361/816; 361/818
(58) Field of Classification Search ................ 361/816, 361/818, 800; 174/35 R, 35 MS; 428/349, 428/458, 457; 257/659, E31.121, E31.122
See application file for complete search history.

(56) References Cited

U.S. PATENT DOCUMENTS

| | | | | |
|---|---|---|---|---|
| 5,314,790 A | * | 5/1994 | Hershey et al. | 430/356 |
| 5,737,047 A | * | 4/1998 | Sakamoto et al. | 349/119 |
| 6,197,408 B1 | * | 3/2001 | Kanbara et al. | 428/209 |
| 6,222,995 B1 | * | 4/2001 | Uchida | 396/6 |
| 6,399,903 B1 | | 6/2002 | Stevenson | 200/5 A |
| 6,429,587 B1 | * | 8/2002 | Sugimachi et al. | 313/582 |
| 6,514,365 B1 | | 2/2003 | Tomita et al. | 156/90 |
| 6,562,454 B2 | | 5/2003 | Takahashi et al. | 428/354 |
| 6,621,003 B2 | * | 9/2003 | Yoshida et al. | 174/35 MS |
| 6,660,792 B2 | * | 12/2003 | Massey et al. | 524/414 |
| 6,766,959 B2 | * | 7/2004 | Kakinoki | 235/492 |

* cited by examiner

*Primary Examiner*—Phuc T Dang
*Assistant Examiner*—Thanh Y Tran
(74) *Attorney, Agent, or Firm*—Oliff & Berridge, plc

(57) ABSTRACT

There is provided an electromagnetic wave shielding sheet which can effectively prevent an adhesive layer from being colored at the time of etching. The electromagnetic wave shielding sheet comprises a laminate of at least a transparent substrate film, an adhesive layer, and an electromagnetic wave shielding layer. The electromagnetic wave shielding layer is formed of a mesh metal foil with densely arranged openings and being transparent. The adhesive layer is substantially colorless and transparent.

3 Claims, 2 Drawing Sheets

ELECTROMAGNETIC WAVE SHIELDING SHEET

BACKGROUND OF THE INVENTION

1. Field of the Invention

The present invention relates to an electromagnetic wave shielding sheet which, when used, is placed on the viewing side of an electromagnetic device such as a display and, in this state, can shield electromagnetic waves and enables the electromagnetic device such as a display to be seen through the sheet.

2. Background Art

It has been pointed out that electromagnetic waves generated from electromagnetic devices adversely affect other electromagnetic devices or human body and animals. To avoid the adverse effect, various electromagnetic wave shielding means have been demanded. In particular, since plasma displays (hereinafter referred to as "PDPs") generate electromagnetic waves with frequencies of 30 to 130 MHz which often adversely affect computers and peripheral devices of computers, minimizing the leakage of electromagnetic waves generated from PDPs to the outside of the PDPs is required.

Conventional means for electromagnetic wave shielding include, for example, a method wherein the electromagnetic device is covered with a case made of a high electrically conductive material and a method wherein the electromagnetic device is covered with an electrically conductive net. These methods, however, sacrifice see-through properties of the electromagnetic device and thus are not suitable for devices where viewing is necessary. On the other hand, electromagnetic wave shielding means composed of a transparent indium tin oxide (hereinafter referred to as "ITO") film provided on a transparent film has been developed. The ITO film has a high level of see-through properties, but on the other hand, the electrical conductivity is so low that the electromagnetic wave shielding capability is poor. As a result, the use of this means has been limited only to devices which generate no significant amount of electromagnetic waves.

On the other hand, a sheet having a combination of electromagnetic wave shielding capability with see-through properties has been developed. This sheet is produced by etching a metal foil stacked onto a film to densely form openings and, thus, to render the metal foil mesh. Further, in this type of sheet, an improved sheet has been provided in which the thickness of the metal foil and the dimension of the mesh have been made proper, the capability of shielding the same level of electromagnetic waves as the level of the electromagnetic waves generated from PDPs has been imparted, and the visibility of the display screen has been improved.

The mesh metal foil formed by etching is difficult to be solely handled. For this reason, for the formation of the mesh metal foil, it is common practice to adopt a method wherein a laminate composed of an untreated metal foil stacked onto a film through an adhesive layer is formed and the metal foil in the laminate is etched to form a pattern.

When etching is carried out with an iron chloride- or copper chloride-containing solution as a conventional etching liquid, however, the adhesive layer is often colored light yellow. Thus, in some cases, the formation of a colorless, transparent etched sheet is difficult. When this sheet is used in such a state that the sheet is placed on the viewing side of PDP, the colored adhesive layer functions like a color absorption filter and often deteriorates blue luminance of PDP.

SUMMARY OF THE INVENTION

The present inventor has now found that, in an electromagnetic wave shielding sheet produced by stacking a metal foil onto a film through an adhesive layer and etching the metal foil to densely form openings and thus to render the metal foil mesh, coloration of the adhesive layer upon etching can be effectively prevented. The present invention has been made based on such finding.

Accordingly, an object of the present invention is to provide an electromagnetic wave shielding sheet in which coloration of an adhesive layer upon etching could have been effectively prevented.

Thus, according to the present invention, there is provided a sheet for electromagnetic wave shielding, comprising a laminate of at least a transparent substrate film, an adhesive layer, and an electromagnetic wave shielding layer, said electromagnetic wave shielding layer being formed of a mesh metal foil with densely arranged openings and being transparent, said adhesive layer being substantially colorless and transparent.

DESCRIPTION OF REFERENCE CHARACTERS IN THE DRAWINGS

10: electromagnetic wave shielding sheet, 11: metal foil, 11': mesh metal foil, 12: blackened layer, 13: adhesive layer, 14: transparent substrate film, 20: electromagnetic wave shielding panel, 30: viewing-side film, 30': backside film, 40: near-infrared absorption film, and 50: glass substrate.

DETAILED DESCRIPTION OF THE INVENTION

Embodiments of the Invention

In a first embodiment of the present invention, there is provided an electromagnetic wave shielding sheet comprising a laminate of at least a transparent substrate film, an adhesive layer, and an electromagnetic wave shielding layer, said electromagnetic wave shielding layer being formed of a mesh metal foil with densely arranged openings and being transparent, said adhesive layer being substantially colorless and transparent. In a second embodiment of the present invention, there is provided an electromagnetic wave shielding sheet wherein, in the first embodiment of the present invention, the value of b* in the L*a*b* color system of the adhesive layer is −6.0 to 6.0. The first and second embodiments of the present invention can provide an electromagnetic wave shielding sheet in which the coloration of the whole laminate structure can be suppressed, and the electromagnetic wave shielding sheet, when placed on the front of PDP, causes no significant lowering in luminance.

In a third embodiment of the present invention, there is provided an electromagnetic wave shielding sheet wherein, in the first or second embodiment of the present invention, the adhesive layer is formed of an adhesive having a glass transition temperature of 20 to 100° C. The third embodiment of the present invention can provide an electromagnetic wave shielding sheet wherein the presence of bubbles has been suppressed.

In a fourth embodiment of the present invention, there is provided an electromagnetic wave shielding sheet wherein, in any one of the first to third embodiments of the present invention, the adhesive layer is formed of an adhesive comprising a saturated polyester resin and an isocyanate compound. The fourth embodiment of the present invention can provide an electromagnetic wave shielding sheet in which the coloration of the adhesive layer has been further suppressed and, in use of the adhesive, satisfactory fluidity can be provided.

Contents of the Invention

Figure 1:
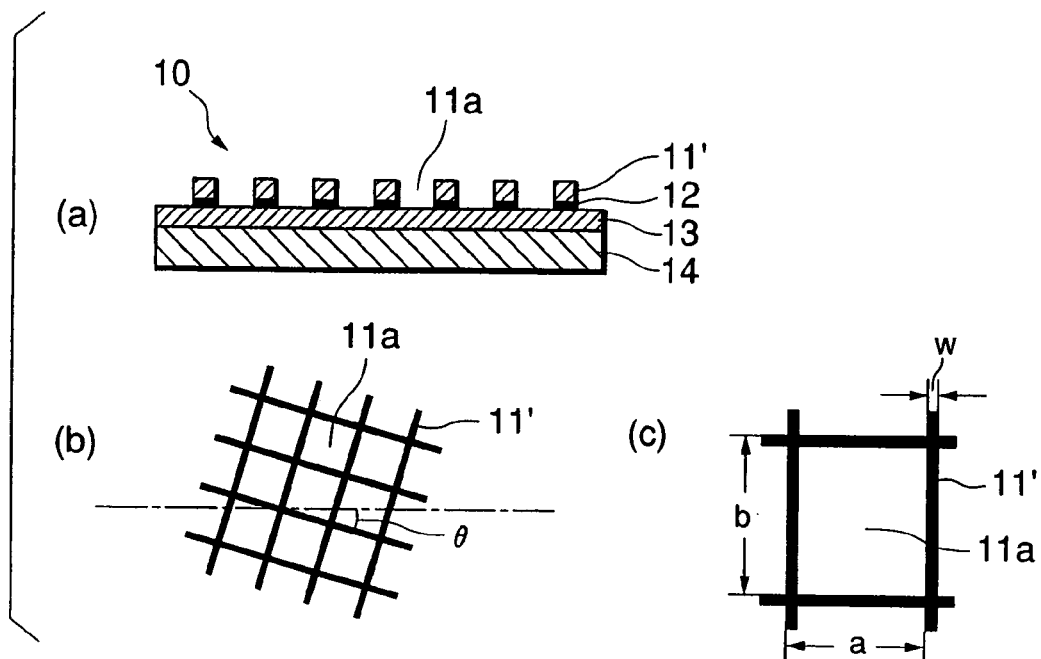
FIG. 1 is a diagram showing an embodiment of an electromagnetic wave shielding sheet.

The present invention will be described in detail with reference to FIG. 1. FIG. 1 is a cross-sectional view showing the structure of an electromagnetic wave shielding sheet according to the present invention. In an electromagnetic wave shielding sheet 10, a mesh metal foil 11' is stacked on a transparent substrate film 14 through an adhesive layer 13 to constitute a laminate 10. A blackened layer 12 is stacked on the metal foil 11' in its transparent substrate film 14 side. A protective film may be stacked on the front and back sides (upper and lower sides in the drawing) of the electromagnetic wave shielding sheet 10.

As shown in FIG. 1(b), in the electromagnetic wave shielding sheet 10, the metal foil 11' is such that openings 11a are densely arranged to form a mesh. As shown in FIG. 1(c), in the opening 11a, the width w of the lines is small and 5 μm to 20 μm. Pitches a, b in the vertical and horizontal directions may be the same or different and each may be about 50 μm to 500 μm. In this case, the percentage opening per unit area is preferably about 90% to 95%. Further, the lines may be inclined at angle θ to the horizontal direction (horizontal direction at the time of viewing). The "mesh" may be a lattice form as shown in FIG. 1(b). The shape of the opening 11a is not limited to this only and may be a shape other than quadrilateral, for example, hexagonal honeycomb, circle, or ellipse.

Laminate Structure of Electromagnetic Wave Shielding Sheet and Production Process Thereof The layer construction of the laminate of at least a transparent substrate film 14 and a transparent electromagnetic wave shielding layer formed of a mesh metal foil 11' with densely arranged openings in the electromagnetic wave shielding sheet according to the present invention and a production process of the laminate will be described with reference to FIGS. 2(a) to (f).

Figure 2:
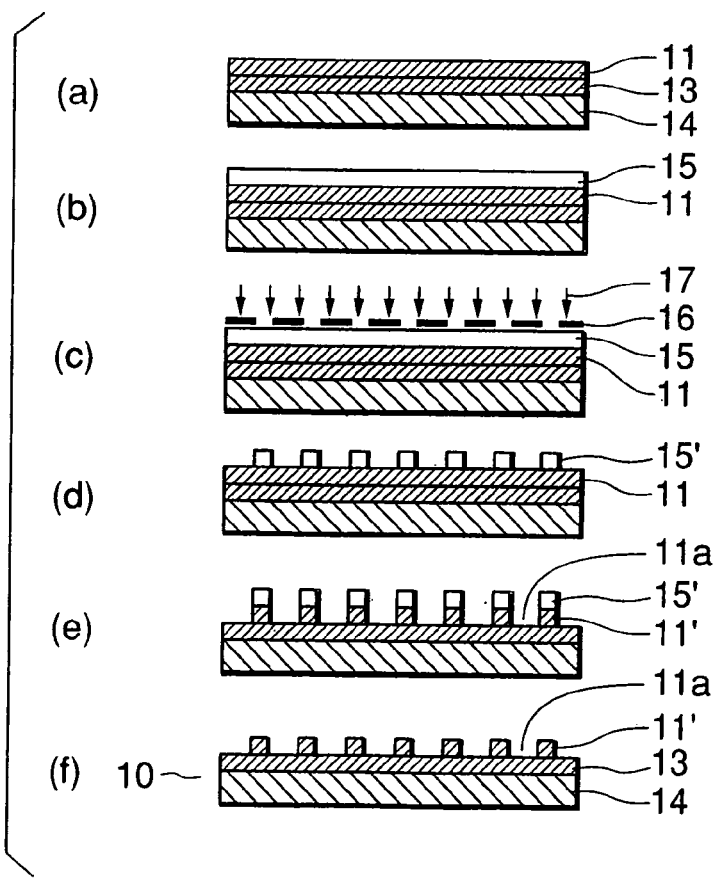
FIG. 2 is a diagram showing a production process of a laminate with a mesh metal foil stacked thereon.

As shown in FIG. 2(a), a laminate of a metal foil 11 stacked onto a transparent substrate film 14 through an adhesive layer 13 is provided. The transparent substrate film 14 may be a film of acrylic resin, polycarbonate resin, polypropylene resin, polyethylene resin, polystyrene resin, polyester resin, cellulosic resin, polysulfone resin, polyvinyl chloride resin or the like. A film of polyester resin such as polyethylene terephthalate resin is preferably used because of its excellent mechanical strength and high transparency. The thickness of the transparent substrate film 14 is not particularly limited. From the viewpoints of mechanical strength and increased bending resistance, however, the thickness of the transparent substrate film 14 is preferably about 50 μm to 200 μm. When the electromagnetic wave shielding sheet 10 is used in the state of being stacked onto another transparent substrate, the thickness of the transparent substrate film 14 may be in or outside the above defined thickness range. Preferably, corona discharge treatment of or the provision of an easy-adhesion layer on one or both sides of the transparent substrate film 14 is if necessary adopted.

The metal foil 11 may be a foil of a metal, such as copper, iron, nickel, or chromium, or an alloy of two or more of these metals, or an alloy composed mainly of one or more of these metals. The use of a copper foil is particularly preferred because of its high electromagnetic wave shielding capability, easy etching, and easy handling. The copper foil may be a foil of rolled copper or electrolytic copper. The use of electrolytic copper is particularly preferred from the viewpoints of easiness of the production of a foil having a small thickness of not more than 10 μm, even thickness and good adhesion to a blackened layer at the time of plating for blackened layer formation. In each of FIGS. 2(a) to (f), although the blackened layer (12) is not shown for simplification, the blackened layer (12) may be provided.

The thickness of the metal foil 11 is preferably 1 μm to 100 μm, more preferably 5 μm to 20 μm. When the thickness of the metal foil 11 is in this range, the electromagnetic wave shielding capability is satisfactory. Further, in this case, openings can easily be formed by etching with predetermined accuracy.

In the metal foil 11, a blackened layer (12) formed by blackening treatment may be provided on the adhesive layer 13 side. This construction can offer rust preventive effect and, at the same time, can impart antireflection properties. The blackened layer can be formed, for example, by Co-Cu alloy plating and can prevent reflection from the surface of the metal foil 11. The surface may be further subjected to chromate treatment for rust preventive purposes. In the chromate treatment, a rust preventive film may be formed by dipping the metal foil 11 in a solution composed mainly of chromic acid or a bichromate and drying the coating. One or both sides of the metal foil 11 may be if necessary subjected to chromate treatment. Alternatively, for example, a commercially available copper foil subjected to chromate treatment may be utilized. When the metal foil 11 used is not a previously blackened metal foil, the metal foil may be blackened in the next step. The blackened layer may be formed by forming a photosensitive resin layer 15, which can function as a resist layer, using a black colored composition and, after the completion of etching, allowing the resist layer to remain unremoved. Alternatively, the blackened layer may be formed by plating which can provide a black film.

When a film of heat-fusible resin, such as highly heat-fusible ethylene-vinyl acetate copolymer resin or ionomer resin, either alone or as a laminate onto another resin film, is used as the transparent substrate film 14, the transparent substrate film 14 and the metal foil 11 may be stacked on top of each other without the provision of any adhesive layer. However, the lamination may be carried out by a dry lamination method using an adhesive layer.

The adhesive constituting the adhesive layer 13 in the electromagnetic wave shielding sheet 10 is preferably such that, in the form of a product, that is, after the action of the etching liquid, the adhesive layer 13 is substantially colorless and transparent. Specifically, the value of b* in the L*a*b* color system is preferably in the range of −6.0 to 6.0. When the b* value is in the above defined range, the bluing or yellowing of the adhesive layer 13 can be effectively reduced. Further, in this case, when the sheet is placed on the viewing side of PDP, the luminance of blue can be satisfactory ensured. When the adhesive layer 13 is formed of a conventional adhesive, the adhesive is generally an organic material. Therefore, the above b* value is in many cases not less than 1.0, and, from this viewpoint, the b* value is more preferably 1.0 to 6.0. When the metal foil 11 constituting the electromagnetic wave shielding sheet 10 is a copper foil, light is subjected to wavelength dispersion due to concaves and convexes (about 1 μm) of the copper foil in its side in contact with the adhesive layer and the refractive index (about 1.50 to 1.55) of the adhesive layer. As a result, blue color is strongly scattered, and the b*, when measured, is found to be somewhat larger and is likely to be not less than 1.0.

In the L*a*b* color system, there is a possibility that, in addition to b*, the value of L* and the value of a* exist. However, assuming that the adhesive used for constituting the adhesive layer 13 is colorless and transparent or substantially colorless and transparent, before the action of the etching liquid, the adhesive is colorless and transparent and, even after the action of the etching liquid, the adhesive is visually seen to be merely colored light yellow. Therefore, the color after the color change can be represented by b* alone which shows color between yellow (in the case where b* is a positive value) and blue (in the case where b* is a negative value).

Adhesives, which can constitute an adhesive layer having a b* value in the range of −6.0 to 6.0 after the action of the etching liquid, include acrylic resins, polyester resins, polyurethane resins, polyvinyl alcohol resins, vinyl chloride-vinyl acetate copolymer resins, and ethylene-vinyl acetate copolymer resins. Examples of other adhesives usable herein include heat-curable resins and ionizing radiation-curable resins, for example, ultraviolet-curable resins and electron beam-curable resins. Among them, a polyurethane resin adhesive or an adhesive comprised of a blend of a saturated polyester with an isocyanate curing agent is preferred because of its high adhesion and the occurrence of no significant color change upon contact with an etching liquid. In particular, the saturated polyester resin, i.e., the main agent of the latter adhesive, is preferred because it has good adhesion to both the metal foil and the resin film, causes no significant color change even upon temperature rise, can provide satisfactory fluidity of the adhesive at the time of lamination, and can realize glass transition temperature regulation through the regulation of the molecular weight.

When the use of a thin metal foil is desired, electrolytic copper is in many cases used. The surface of the electrolytic copper is rough, i.e., has a roughness Ra of about 0.1 to 1.0 μm, and is conspicuous. Therefore, the electrolytic copper can be conveniently placed on the viewing side after blackening treatment. Since, however, at the time of lamination, bubbles are likely to enter the interface of the laminate, the use of an adhesive having a glass transition temperature of 20 to 100° C. is preferred from the viewpoint of a relationship with the nip temperature at the time of the lamination. When the glass transition temperature is in this range, the adhesion can be improved and, at the same time, curing on a level high enough to eliminate the bubbles can be realized. Further, the amount of the adhesive applied is preferably 1 to 10 g/m² on a dry basis from the viewpoint of filling up the surface irregularities of the electrolytic copper. The amount of the adhesive applied in this range is advantageous in that the adhesion can be improved, satisfactory drying can be realized at the time of coating, and, even in the case of some color change, the b* value (absolute value) can be kept at the minimum value.

As shown in FIG. 2(b), a photosensitive resin layer 15, which can be brought into a resist layer in a subsequent etching process, is then stacked onto the metal foil 11 in the laminate thus obtained. The photosensitive resin layer 15 may be either positive-working or negative-working. In the drawings associated with the present invention, however, a negative-working photosensitive resin layer is shown for convenience.

As shown in FIG. 2(c), an ionizing radiation, such as ultraviolet light 17, is applied through a pattern 16 onto the stacked photosensitive resin layer 15. Alternatively, the exposure through the pattern 16 may be carried out by a method involving electron beam scanning without the use of the pattern 16. That is, the exposure may be carried out by any method so far as pattern-wise exposure is possible. When the photosensitive resin layer 15 is negative-working, the exposed portion is cured and is insolubilized in a developing solution, while the unexposed portion is soluble in the developing solution. On the other hand, when the photosensitive resin layer 15 is positive-working, the exposed portion is decomposed and consequently is solubilized in the developing solution.

The exposed photosensitive resin layer 15 is developed with a developing solution. In this case, since the layer is divided into soluble portions and insoluble portions by the above exposure, the soluble portions are dissolved and removed by allowing a developing solution, which has been predetermined depending upon the type of the photosensitive resin, to act on the exposed photosensitive resin layer 15. As shown in FIG. 2(d), when the photosensitive resin layer 15 is negative-working, the cured patterned photosensitive resin layer 15' remains unremoved on the metal foil 11.

Etching is then carried out utilizing the cured photosensitive resin layer 15', which has remained unremoved on the metal foil 11, as a resist. The etching is carried out with a predetermined etching liquid until the metal foil 11 in its portions not covered with the resist is removed by etching to form openings. When openings having a predetermined shape have been formed, the etching is completed. Thus, as shown in FIG. 2(e), a mesh metal foil 11' with densely arranged openings 11a is provided.

When the cured photosensitive resin layer 15' as the resist still stays on the mesh metal foil 11' at the point of time of the completion of etching, the resist is generally removed with a resist removing liquid to expose a mesh metal foil 11' with densely arranged openings 11a as shown in FIG. 2(f). Thus, a laminate 10 is provided wherein a mesh metal foil 11' has been stacked onto a transparent substrate film 14 through an adhesive layer 13.

In the laminate of at least a transparent substrate film 14 and a mesh metal foil 11' with densely arranged openings, if necessary, for example, the step of degreasing or cleaning the surface of the metal foil 11 to be fabricated or the step of washing away a resist removing liquid after the removal of the residual resist may be additionally provided.

In the electromagnetic wave shielding sheet 10 which is a laminate of at least a transparent substrate film, an adhesive layer, and a transparent electromagnetic wave shielding layer of a mesh metal foil with densely arranged openings, a protective film may be stacked on the transparent substrate film side and/or the mesh metal foil 11' side. The protective film stacked on the transparent substrate film side can protect the lower surface of the transparent substrate film against damage upon contact during handling or unintentional contact, or can protect the exposed surface of the transparent substrate film 14 against the contamination or attack in the steps of providing a resist layer on the metal foil 11 and etching the metal foil, particularly in the step of etching. The protective film stacked on the metal foil 11' side can protect small-width metal foil lines constituting the mesh metal foil 11' against breaking upon contact or the like.

Figure 3:
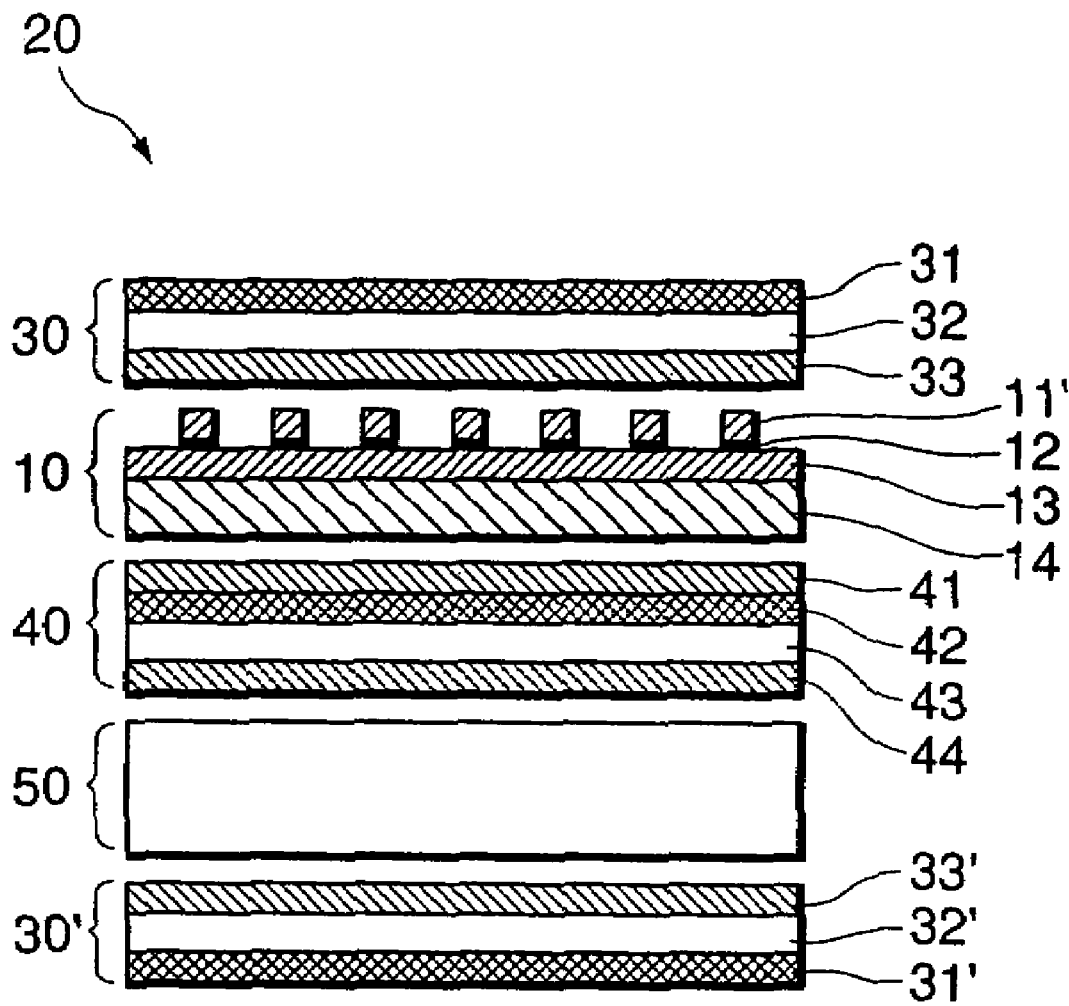
FIG. 3 is a diagram showing an embodiment of an electromagnetic wave shielding panel.

As shown in FIG. 3, preferably, the protective film is stacked separably on both sides of the electromagnetic wave shielding sheet 10, and, as the occasion demands, the protective film is peeled off. In this case, the peel strength is preferably 5 mN/25 mm-width to 5 N/25 mm-width, more preferably 10 mN/25 mm-width to 100 mN/25 mm-width. When the peel strength is in the above defined range, unintentional separation of the protective film upon contact during handling or upon unintentional contact can be prevented. Further, when stripping off the protective film is required, the separation of the mesh metal foil 11' side together with the protective film can be prevented.

Electromagnetic Wave Shielding Panel

FIG. 3 is a schematic diagram showing an electromagnetic wave shielding panel which has been configured using the electromagnetic wave shielding sheet 10 according to the present invention. The upper side of FIG. 3 is the viewing side, and the lower side is the rear side. The electromagnetic wave shielding panel is placed on the viewing side of a display such as PDP (not shown). In an electromagnetic wave shielding panel 20, a viewing side (=front face) film 30 is stacked through the adhesive layer 13 onto the metal foil 11' side of the electromagnetic wave shielding sheet 10, wherein the mesh metal foil 11' has been stacked onto the transparent substrate film 14 (that is, on the viewing side) (the metal foil 11' on its adhesive layer 13 side being optionally provided with the blackened layer 12). The viewing-side film 30 comprises a pressure-sensitive adhesive layer 33, a film 32, and a multilayer 31 stacked in that order from the laminate 10 side. The multilayer 31 includes a hardcoat, an antireflection layer, and an antifouling layer stacked in that order. In FIG. 3, the laminates 30, 10, 40, 50, and 30' are shown while leaving a space between the laminates for easy understanding of the whole construction. In fact, the five laminates shown in the drawing are stacked on top of one another without leaving any space.

A near-infrared absorption film 40, a glass substrate 50, and a rear side (=backside) film 30' are stacked in that order on the transparent substrate film 14 side in the electromagnetic wave shielding sheet 10. The near-infrared absorption film 40 comprises a pressure-sensitive adhesive layer 41, a near-infrared absorption layer 42, a film 43, and a pressure-sensitive adhesive layer 44 stacked in that order from the electromagnetic wave shielding sheet 10 side. The glass substrate 50 is provided to ensure the mechanical strength, self-supporting properties, or flatness of the whole electromagnetic wave shielding panel 20. The backside (=rear side) film 30' comprises a pressure-sensitive adhesive layer 33', a film 32', and a multilayer 31' stacked in that order from the glass substrate 50 side. The multilayer 31' includes a hardcoat, an antireflection layer, and an antifouling layer stacked in that order. In this embodiment, the backside film 30' is the same as the viewing-side film 30.

The electromagnetic wave shielding panel 20 described above with reference to FIG. 3 is mere an embodiment and preferably comprises the above laminates stacked on top of one another. If necessary, however, alterations and modifications are possible. For example, any of the laminates or layers may be omitted, or a laminate having a combination of functions of layers may be provided and used.

EXAMPLES

Example 1

A transparent polyethylene terephthalate resin (=PET) film having a width of 700 mm and a thickness of 100 μm (a product of Toyobo Co., Ltd., stock number: A 4300) and a copper foil with one side thereof being blackened, which had a width of 700 mm and a thickness of 10 μm (a product of Furukawa Circuit Foil Co., Ltd., stock number: BW-S), were provided. The PET film and the copper foil were continuously laminated onto top of each other by dry lamination using a two-component-curable polyurethane resin adhesive (a product of Takeda Chemical Industries, Ltd.; a mixture of Takelac A 310 (main agent, Tg=20° C.)/Takenate A 10 (curing agent)/ethyl acetate=12/1/21 (mass ratio); the parts and mixing ratio being by mass (the same shall apply hereinafter)) so that the blackened surface faced inward. A protective film A (a product of Panac Kogyo K.K., stock number: HT-25) composed of a PET film and a pressure-sensitive adhesive layer stacked on the PET film and having a total thickness of 28 μm, in which the surface of the PET film remote from the pressure-sensitive adhesive layer had been subjected to corona discharge treatment, was then laminated by means of a laminator roller onto the surface of the PET film remote from the copper foil to prepare a laminate having a construction of protective film A/PET film/adhesive layer/copper foil. The glass transition temperature of the main agent in the polyurethane resin adhesive was 20° C., and the coverage on a dry basis of the polyurethane resin adhesive was 6 g/m².

Casein was coated onto the copper foil side of the laminate thus obtained, and the coating was dried to form a photosensitive resin layer. A mask with a pattern formed thereon was put on top of the photosensitive resin layer, and the laminate was then subjected to contact exposure to ultraviolet light. After the exposure, development with water and curing treatment were carried out, followed by baking at 100° C. to form a resist pattern. The pattern of the mask was such that a mesh pattern of pitch: 300 μm and line width: 10 μm was formed in an area of 600 mm×800 mm.

A ferric chloride solution (Baume degree: 42, temperature: 30° C.) was sprayed onto the laminate, with a resist pattern formed thereon, from its resist pattern side to perform etching. Thereafter, the laminate was washed with water, and the resist was then separated with an alkaline solution. After the separation, washing and drying were carried out to prepare a laminate having a construction of protective film/PET film/adhesive layer/copper mesh. A urethane acrylate ultraviolet-curable resin is coated on the laminate in its copper mesh side. An untreated PET film was laminated onto the coating. Ultraviolet light was then applied to the assembly to cure the coating, and the untreated PET film was separated and removed. The purpose of this procedure is to eliminate cloudiness derived from the concaves and convexes on the copper mesh side by filling with the ultraviolet-curable resin and to compare the appearance (presence or absence of bubbles) of the laminate before the procedure with that of the laminate after the procedure.

Example 2

The procedure of Example 1 was repeated, except that an adhesive having the following composition was used and the temperature of the etching liquid was changed to 60° C. to increase the etching speed.

| (Composition of adhesive) | |
|---|---|
| Saturated polyester resin (Vylon 200, manufactured by Toyobo Co., Ltd., Tg: 67° C.) | 30 parts |
| Isocyanate curing agent (tradename: "XEL Curing Agent," manufactured by The Inctec Inc.) | 3 parts |
| Solvent (toluene/methyl ethyl ketone = 1/1) | 70 parts |

Comparative Example 1

The procedure of Example 1 was repeated, except that the temperature of the etching liquid was changed to 60° C.

Comparative Example 2

The procedure of Example 1 was repeated, except that an adhesive having the following composition was used and the temperature of the etching liquid was changed to 60° C. to increase the etching speed.

| (Composition of adhesive) | |
| --- | --- |
| Urethane acrylate ultraviolet-curable adhesive (Tg: 102° C.) | 30 parts |
| Ethyl acetate | 70 parts |

Evaluation Test

The electromagnetic wave shielding sheets prepared in Examples 1 and 2 and Comparative Examples 1 and 2 were compared. The results are shown in Table 1. The contents of the items in Table 1 are as follows.

"b*" shows a value measured under conditions of transmission mode, light conditions of D65, and view angle 2 degrees with a spectrophotometer (stock number: CM-3700d, manufactured by Minolta Camera Co., Ltd.) in such a manner that the copper mesh face was used as a light incident face.

"Bubbles" shows the presence or absence of bubbles in the adhesive layer as observed in a transmission mode from the copper mesh face side under an optical microscope.

"Appearance" shows cloudiness and the like derived from bubbles observed as viewed in the transmission mode from the PET face side. Tg of the adhesive is the glass transition temperature of the adhesive used.

○ in the evaluation of "bubbles" and "appearance" represents that there is no problem on "bubbles" or "appearance".

TABLE 1

| | b* | Bubbles | Appearance | Tg of adhesive |
| --- | --- | --- | --- | --- |
| Ex. 1 | 5.5 | ○ | ○ | 20° C. |
| Ex. 2 | 4.6 | ○ | ○ | 67° C. |
| Comp. Ex. 1 | 6.8 | ○ | Somewhat conspicuous coloring | 20° C. |
| Comp. Ex. 2 | 2.3 | Significant | Cloudy | 102° C. |

The invention claimed is:

1. A sheet for electromagnetic wave shielding for use in a display, comprising a laminate of at least a transparent substrate film, an adhesive layer, and an electromagnetic wave shielding layer,
    said electromagnetic wave shielding layer being formed of a mesh metal foil with densely arranged openings and being transparent, wherein said mesh metal foil with densely arranged openings is formed by stacking a metal foil on said transparent substrate film through said adhesive layer and etching said metal foil,
    said adhesive layer being substantially colorless and transparent after the etching treatment.

2. The sheet according to claim 1, wherein the adhesive layer is formed of an adhesive having a glass transition temperature of 20 to 100° C.

3. The sheet according to claim 1, wherein the adhesive layer is formed of an adhesive comprising a saturated polyester resin and an isocyanate compound.

* * * * *